(12) United States Patent
Kohno et al.

(10) Patent No.: US 7,767,377 B2
(45) Date of Patent: Aug. 3, 2010

(54) POSITIVE TYPE RESIST COMPOSITION, PROCESS FOR FORMING RESIST PATTERN, AND PROCESS FOR PERFORMING ION IMPLANTATION

(75) Inventors: Shinichi Kohno, Kawasaki (JP); Takeshi Iwai, Kawasaki (JP); Ryotaro Hayashi, Kwasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 596 days.

(21) Appl. No.: 11/587,713

(22) PCT Filed: Apr. 19, 2005

(86) PCT No.: PCT/JP2005/007439
§ 371 (c)(1),
(2), (4) Date: Oct. 26, 2006

(87) PCT Pub. No.: WO2005/106587
PCT Pub. Date: Nov. 10, 2005

(65) Prior Publication Data
US 2008/0020321 A1  Jan. 24, 2008

(30) Foreign Application Priority Data
Apr. 28, 2004  (JP) .............................. 2004-134075

(51) Int. Cl.
G03F 7/004 (2006.01)
G03F 7/30 (2006.01)
(52) U.S. Cl. ................. 430/270.1; 430/326; 430/910
(58) Field of Classification Search ........... 430/270.1, 430/326, 910
See application file for complete search history.

(56) References Cited

U.S. PATENT DOCUMENTS

| | | | |
|---|---|---|---|
| 6,200,725 B1 * | 3/2001 | Takechi et al. ........... | 430/270.1 |
| 6,329,125 B2 | 12/2001 | Takechi et al. | |
| 6,399,275 B1 | 6/2002 | Sugeta et al. | |
| 6,982,140 B2 | 1/2006 | Hada et al. | |
| 7,005,230 B2 * | 2/2006 | Yamamoto et al. ....... | 430/270.1 |
| 2002/0042018 A1 | 4/2002 | Maeda et al. | |
| 2003/0108809 A1 | 6/2003 | Sato | |
| 2003/0232270 A1 | 12/2003 | Chen et al. | |
| 2005/0250924 A1 * | 11/2005 | Watanabe et al. .......... | 526/319 |

FOREIGN PATENT DOCUMENTS

| | | |
|---|---|---|
| JP | H10-144586 | 5/1998 |
| JP | 2001-209179 | 8/2001 |
| JP | 2002-169289 | 6/2002 |
| JP | 2003-107710 | 4/2003 |
| JP | 2004-203898 | 7/2004 |
| JP | 2005-234015 | 9/2005 |
| TW | 200300869 | 11/1991 |
| TW | 571178 | 2/2002 |

OTHER PUBLICATIONS

Office Action and Search Report issued May 6, 2008, on the counterpart Taiwanese Patent Application No. 094113136.
Office Action issued on Oct. 28, 2008 in the counterpart Japanese Patent Application No. 2004-134075.
Office Action issued in counterpart Japanese Patent Application No. 2004-134075, dated Mar. 3, 2009.

* cited by examiner

Primary Examiner—John S Chu
(74) Attorney, Agent, or Firm—Knobbe Martens Olson & Bear, LLP

(57) ABSTRACT

The present invention is a positive type resist composition comprising a resin component (A) for use in a resist, having alkali solubility which increases under the action of an acid, an acid generator component (B) which generates an acid upon being exposed, and an organic solvent which dissolves the resin component (A) and the acid generator component (B), wherein the resin component (A) contains the resin component (A1) for use in a resist having alkali solubility which increases under the action of an acid having the following structural units (a1), (a2) and (a3):
structural unit (a1): a structural unit derived from an (α-lower alkyl) acrylic ester which contains acid-dissociable, dissolution-inhibiting groups expressed by the following general formula (1):
[chemical formula 1]

[chemical formula 1]

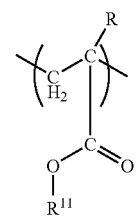

(1)

(in formula (1), R represents a hydrogen atom or a lower alkyl group, $R^{11}$ represents acid-dissociable, dissolution-inhibiting groups consisting of chain tertiary alkyl groups),
structural unit (a2): a structural unit derived from an (α-lower alkyl) acrylic ester which contains lactone-containing monocyclic or polycyclic groups,
structural unit (a3): a structural unit derived from an (α-lower alkyl) acrylic ester which contains polycyclic and alicyclic hydrocarbon groups which contain polar groups.

10 Claims, No Drawings

POSITIVE TYPE RESIST COMPOSITION, PROCESS FOR FORMING RESIST PATTERN, AND PROCESS FOR PERFORMING ION IMPLANTATION

TECHNICAL FIELD

The present invention relates to a positive type resist composition, a process for forming a resist pattern, and a process for performing ion implantation.

Priority is claimed on Japanese Patent Application No. 2004-134075, filed Apr. 28, 2004, the content of which is incorporated herein by reference.

BACKGROUND ART

In recent years, in the production of semiconductor devices or liquid-crystal-display elements, down-sizing has rapidly progressed as the lithographic technology advances. In general, as a method for down-sizing, wavelength of an exposure light source is shortened. Specifically, KrF excimer laser (248 nm) and ArF excimer laser (193 nm) are introduced now, although the ultraviolet rays represented by g line or i line were used conventionally.

As a resist for use in such an excimer laser, a chemically amplified resist composition which satisfies the conditions for high resolution which can reproduce a fine pattern is known, and the resist consists of a base resin having alkali solubility which changes by an action of acid, and an acid generator which generates an acid upon being exposed, as the basic components. The above chemically amplified resist composition involves both a negative type which contains an acid generator, a cross-linking agent, and an alkali-soluble resin as a base resin, and a positive type which contains an acid generator and a resin of which alkali solubility increases by the action of acid.

Hitherto, in the KrF excimer laser lithography, as a base resin of a chemically amplified resist, polyhydroxy styrene having a high transparency to a KrF excimer laser (248 nm) and a derivative therefrom obtained by protecting its hydroxyl group with an acid-dissociable, dissolution-inhibiting group (protecting group) has been generally used.

Furthermore, down-sizing of semiconductor devices has progressed increasingly, development of processes using an ArF excimer laser (193 nm) has been furthered energetically, and resists for use in ArF having various compositions have been proposed. Among them, an acrylic type resin with a high transparency at near 193 nm is known well as a base resin of the most general resist for use in ArF. As the above acrylic type resin, since it excels in dry etching resistance, the resin which has, as a main chain, the structural unit derived from (α-lower alkyl) acrylic ester [(α-lower alkyl) acrylate] which contains polycyclic and alicyclic saturated hydrocarbon groups such as an adamantane structure as an acid-dissociable, dissolution-inhibiting group at its ester part (side chain part) is generic (for example, see Patent document 1).

[Patent document 1] Japanese Unexamined Patent Application, First Publication No. H10-161313 official report However, there is a problem in that the acrylic type resin containing an acid-dissociable, dissolution-inhibiting group which consists of a polycyclic and alicyclic saturated hydrocarbon group such as the above adamantane structure is expensive. Therefore, in the positive type resist composition using acrylic type resin, cost reduction and dry etching resistance are needed.

Moreover, in the ion implantation process, a positive type resist composition which can reduce cost and which excels in barrier properties of ions and destructive resistance of the resist pattern is needed.

The present invention is made in order to solve the above subjects, and it is an object of the present invention to realize cost reduction and dry etching resistance in the positive type resist composition using acrylic type resin. Moreover, it is another object of the present invention to improve the barrier properties of ions and the destructive resistance of a resist pattern in an ion implantation process, while maintaining low cost.

DISCLOSURE OF INVENTION

In order to attain the above object, the present invention adopts the following constitution.

The positive type resist composition of the present invention includes a resin component (A) for use in a resist, having an alkali solubility which increases under the action of an acid, an acid generator component (B) which generates an acid upon being exposed, and an organic solvent which dissolves the resin component (A) and acid generator component (B), wherein the resin component (A) contains a resin component (A1) for use in a resist having alkali solubility which increases under the action of an acid having the following structural units (a1), (a2) and (a3):

Structural unit (a1): a structural unit derived from (α-lower alkyl) acrylic ester which contains acid-dissociable, dissolution-inhibiting groups expressed by the following general formula (1):

[chemical formula 1]

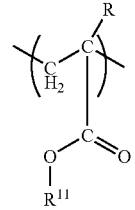

(In formula (1), R represents a hydrogen atom or a lower alkyl group, $R^{11}$ represents an acid dissociable, dissolution inhibiting groups consisting of chain tertiary alkyl groups).

Structural unit (a2): a structural unit derived from (α-lower alkyl) acrylic ester which contains lactone-containing monocyclic or polycyclic groups, Structural unit (a3): a structural unit derived from (α-lower alkyl) acrylic ester which contains polycyclic and alicyclic hydrocarbon groups which contain polar groups.

Moreover, the positive type resist composition of the present invention is used for the positive type resist composition for use an in ion implantation process.

Moreover, the process for forming a resist pattern of the present invention includes forming a resist layer on a substrate using said positive type resist composition as set forth in above, exposing said resist layer selectively, and thereafter performing an alkali development to form a resist pattern.

Moreover, the process for performing an ion implantation of the present invention includes forming a resist layer on a substrate using said positive type resist composition as set forth in above, exposing said resist layer selectively, performing an alkali development to form a resist pattern, and thereafter performing an ion implantation while using said resist pattern as a mask.

It should be noted that, in the present invention, the wording "(α-lower alkyl) acrylic acid" means one or both of α-lower alkyl acrylic acid and acrylic acid. Moreover, the wording "α-lower alkyl acrylic acid" means that which is obtained by substituting the hydrogen atom which is bonded to the α carbon atom of acrylic acid with a lower alkyl group.

The wording "(α-lower alkyl) acrylate" means one or both of α-lower alkyl acrylate and acrylate. Moreover, the wording "α-lower alkyl acrylate" means that which is obtained by substituting the hydrogen atom which is bonded to the α carbon atom of acrylic ester with a lower alkyl group.

Moreover, the wording "structural unit" means a monomer unit which constitutes a polymer.

Moreover, the wording "the structural unit derived from (α-lower alkyl) acrylate" means a structural unit obtained by cleaving the ethylenic double bond of (α-lower alkyl) acrylate.

Moreover, the wording "exposure" involves "irradiation" of an electron ray etc.

In accordance with the present invention, cost reduction and dry etching resistance can be realized in the positive type resist composition using acrylic type resin.

Moreover, in accordance with the present invention, in the positive type resist composition using acrylic type resin, it is possible to reduce cost and improve the barrier properties of ions and destructive resistance of a resist pattern in the ion implantation process.

BEST MODE FOR CARRYING OUT THE INVENTION

[Positive Type Resist Composition]

The positive type resist composition of the present invention is a positive type resist composition which is obtained by dissolving a resin component (A) for use in a resist of which alkali solubility increases under the action of an acid, and an acid generator component (B) which generates an acid upon being exposed in an organic solvent, in which the above (A) component contains a specific component (A1).

(A) Component (A1) Component

The (A1) component has structural units (a1), (a2), and (a3).

The structural unit (a1) has alkali-dissociable, dissolution-inhibiting groups (acid-dissociable, dissolution-inhibiting groups) which make the component (A1) before exposure alkali-insoluble, and increase the alkali solubility of the component (A1) after exposure under the action of the acid which is generated from the component (B) by dissociating the above acid-dissociable, dissolution-inhibiting groups. Thereby, it is possible to change the whole component (A) from alkali-insoluble to be alkali-soluble.

Structural Unit (a1)

The structural unit (a1) is expressed by the above general formula (1), which is characterized by having an acid-dissociable, dissolution-inhibiting group which consists of a chain tertiary alkyl group (alkyl group having no cyclic structure and having tertiary carbon atoms). Since such a structural unit (a1) is low cost, reduction of cost of a resist composition can be realized by using this.

In general formula (1), R represents a hydrogen atom or a lower alkyl group, and R may be either. The above lower alkyl group may be either linear or branched, preferably is an alkyl group having 1 to 5 carbon atoms, and more preferably is a methyl group having one carbon atom.

In general formula (1), $R^{11}$ is a tertiary alkyl group, preferably a tertiary alkyl group having 4 to 10 carbon atoms. Specifically, tert-butyl group, tert-amyl group etc. are exemplary, and tert-butyl group is preferable, in view of reduction of cost.

The percentage of structural unit (a1) preferably ranges from 20 to 60 mol %, for example, in component (A1), and more preferably ranges from 30 to 50 mol %. By making it within this range, it is possible to satisfy all of the demand of reduction of cost, improvement of dry etching resistance, ion barrier properties in the ion implantation process, and destructive resistance of a resist pattern.

Structural Unit (a2)

The structural unit (a2) is a structural unit derived from (α-lower alkyl) acrylic ester which contains lactone-containing monocyclic or polycyclic groups. Thereby, dry etching resistance, ion barrier properties during an ion implantation process, and the destructive resistance of a resist pattern can be improved. Moreover, the adhesiveness between a resist layer and a substrate is increased and the occurrence of film peeling etc. is also reduced in a fine resist pattern. Moreover, the hydrophilicity of the whole component (A1) increases, compatibility with a developer increases, and the alkali solubility in an exposed part improves, thereby contributing to improving resolution.

As the structural unit (a2), a structural unit in which a monocyclic group consisting of a lactone ring, or polycyclic and alicyclic hydrocarbon groups having a lactone ring are bonded to the ester side chain part of (α-lower alkyl) acrylate is exemplary. As for an α-lower alkyl group, it is the same as that of the above.

It should be noted that the wording lactone ring at this time indicates one ring including a —O—C(O)-structure, and this is counted as the first ring. Therefore, when it has a lactone ring only, it is called a monocyclic group, on the other hand, when it has another ring structure further, it is called polycyclic group, regardless of its structure.

And specifically as a monocyclic group, and a polycyclic group, for example, a monocyclic group obtained by removing one hydrogen atom from γ-butyrolactone, and a polycyclic group obtained by removing one hydrogen atom from a lactone ring containing polycycloalkane, etc. are exemplary.

Specifically as the structural unit (a2), structural units expressed as the following constitutional formulae (IV) to (VII), for example, are preferable.

[chemical formula 2]

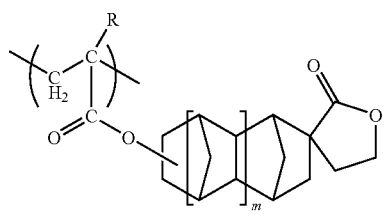

(IV)

(in formula (IV), R is the same as the above, and m is 0 or 1.)

[chemical formula 3]

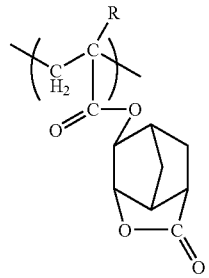

(V)

(in formula (V), R is the same as the above.)

[chemical formula 4]

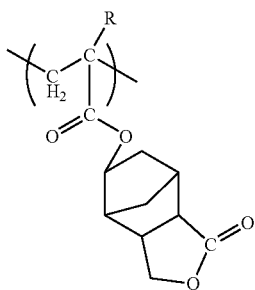

(VI)

(in formula (VI), R is the same as the above.)

[chemical formula 5]

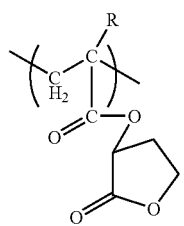

(VII)

(in formula (VII), R is the same as the above.)

Among these, the structural unit expressed as above general formula (VII) is preferable because it satisfies all of the demands of low cost and dry etching resistance, barrier properties of ions in an ion implantation process, and the destructive resistance of resist patterns.

The structural unit (a2) is preferably contained in an amount ranging from 20 to 60 mol %, especially ranging from 20 to 50 mol % to the sum total of all of the structural units which constitute component (A1). By making the percent of structural unit (a2) not less than the lower limit, dry etching resistance, the ion barrier properties in the ion implantation process, and the destructive resistance of a resist pattern can be improved. Moreover, quantitative balance with the other structural units can be maintained by making the percentage of structural unit (a2) not more than the upper limit.

Structural Unit (a3)

The structural unit (a3) is a structural unit derived from an (α-lower alkyl) acrylate which contains polycyclic and alicyclic hydrocarbon groups which contain polar groups. Thereby, dry etching resistance, the ion barrier properties in an ion implantation process, and the destructive resistance of a resist pattern can be improved.

Moreover, the hydrophilicity of the whole component (A1) increases, the compatibility with a developer increases, and the alkali solubility in an exposed part is improved, thereby contributing to improving resolution.

As for an α-lower alkyl group, it is the same as in the above.

As polar groups, hydroxyl groups, cyano groups (CN groups), etc. are exemplary, and especially hydroxyl groups or cyano groups are preferable.

Although polycyclic and alicyclic hydrocarbon groups may be either unsaturated or saturated, they are preferably saturated. And the above polar group may be bonded to a carbon atom which constitutes the alicyclic hydrocarbon groups.

As a polycyclic and alicyclic hydrocarbon group, groups obtained by removing one hydrogen atom from bicycloalkane, tricycloalkane, tetracycloalkane, etc. are exemplary. Specifically, groups obtained by removing one hydrogen atom from polycycloalkanes, such as adamantane, norbornane, isobornane, tricyclodecane, and tetracyclododecane, etc. are exemplary.

As the structural unit (a3), a structural unit expressed as the following general formula (VIII) is exemplary as a preferable one.

[Chemical formula 6]

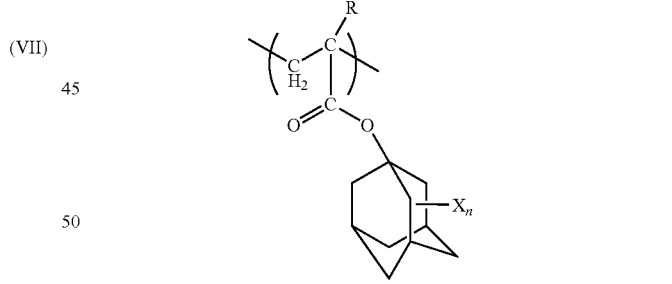

(VIII)

(in formula (VIII), R is the same as in the above, X is a polar group, and n is an integer of 1 to 3.)

That is, among this formula, the number of polar groups X is selected from the range of 1 to 3 (the range of the number n), and it is preferably 1.

Among these, one in which n is 1 and the polar group is bonded to the tertiary carbon of adamantyl group is preferable.

The structural unit (a3) is contained preferably in an amount ranging from 10 to 50%, more preferably in an amount ranging from 20 to 40 mol % to the sum total of all of the constitutional units which constitute component (A1). By making the percent of structural unit (a3) not less than the lower limit, dry etching resistance, the ion barrier properties in the ion implantation process, and the destructive resistance of a resist pattern can be improved, whereas quantitative balance with the other structural units can be maintained by making the percentage of structural unit (a3) not more than the upper limit.

The component (A1) may further contain any structural units other than structural units (a1), (a2), and (a3).

For example, structural unit (a4) derived from (α-lower alkyl) acrylic ester which contains polycyclic and alicyclic hydrocarbon groups other than structural units (a2) and (a3) is exemplary. As for an α-lower alkyl group, it is the same as in the above.

Structural Unit (a4)

Here, in structural unit (a4), the wording "other than structural units (a2) and (a3)" means that it does not overlap these, and although the polycyclic and alicyclic hydrocarbon groups (polycyclic groups) may be either saturated or unsaturated, it is preferable that they are saturated. And various polycyclic groups, similar to those of the above structural unit (a3), are exemplary.

In particular, at least one group selected from a tricyclodecanyl group, adamantly group, and tetracyclododecanyl group is industrially available and hence preferable.

Specifically, as the structural unit (a4), those having a structure expressed as the following formulae (IX) to (XI) are exemplary.

[Chemical formula 7]

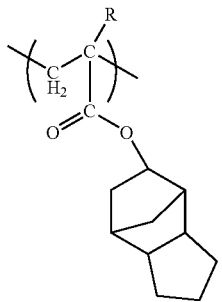

(IX)

(in formula (IX), R is the same as in the above.)

[Chemical formula 8]

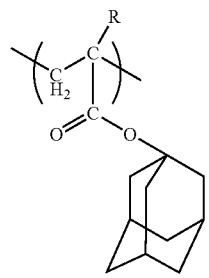

(X)

(in formula (X), R is the same as in the above.)

[Chemical formula 9]

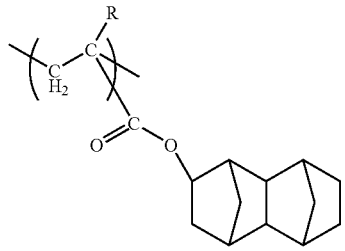

(XI)

(in formula (XI), R is the same as in the above.)

The structural unit (a4) is contained in an amount ranging from 1 to 25 mol %, preferably ranging from 10 to 20 mol % to the sum total of all of the structural units which constitute component (A1).

Although the mass average molecular weight (based on polystyrene equivalent weight average molecular weight determined using GPC) of the resin of component (A1) is not particularly limited, preferably it ranges from 5,000 to 30,000, more preferably it ranges from 6,000 to 20,000.

Component (A1) is usually a copolymer.

Component (A1) can be obtained by polymerizing monomers from which each structural unit is derived according to a well-known radical polymerization using a radical polymerization initiator, for example, azobisisobutyronitrile (AIBN) etc.

Component (A1) essentially contains structural units (a1), (a2), and (a3). The sum total of these structural units is preferably not less than 80 mol %, more preferably not less than 90 mol % of component (A1). Component (A1) may be used solely, or two or more sorts may be mixed to be used.

Moreover, it is possible to add arbitrarily to component (A1) one or more of resins which are used, for example, as a resin for use in the resist compositions for an ArF excimer laser, in an amount within the limit by which the object of the present invention is attained, in order to adjust the performance, other than component (A1).

From a point of reduction of cost, the content of component (A1) in component (A) is preferably not less than 50 mass %, more preferably not less than 70 mass % (it may be 100 mass %).

As the resin component to be added, for example, that which is obtained by combining structural unit (a5) derived from (α-lower alkyl) acrylic acid which has acid-dissociable, dissolution-inhibiting groups different from structural unit (a1), with one or more selected from the above structural units (a2), (a3), and (a4) can be used. Among them, a resin which essentially contains structural units (a5), (a2), and (a3), and contains structural unit (a4) arbitrarily is preferable.

Structural Unit (a5)

The structural unit (a5) is a structural unit which is derived from (α-lower alkyl) acrylic acid which has acid-dissociable, dissolution-inhibiting groups different from structural unit (a1).

Although that which is used conventionally as the resin for use in a chemically amplified resist can be used arbitrarily as this acid-dissociable, dissolution-inhibiting groups, in particular, an acid-dissociable, dissolution-inhibiting group which contains polycyclic and alicyclic hydrocarbon groups (polycyclic groups) is preferably used in order to improve dry etching resistance and resolution.

As structural unit (a5), that which is expressed as above general formula (1) in which $R^{11}$ is, for example, an acid-dissociable, dissolution-inhibiting group which contains a polycyclic and alicyclic hydrocarbon group is preferably used. Although this alicyclic hydrocarbon group may be either saturated or unsaturated, it is preferably saturated.

Polycyclic groups as such can be suitably selected from, for example, among those proposed in the resin component for use in the resist composition of an ArF excimer laser. Among them, an adamantyl group, norbornyl group, and tetracyclododecanyl group are industrially preferable.

More specifically, those expressed as the following general formulae (I), (II) or (III), etc. are exemplary.

[Chemical formula 10]

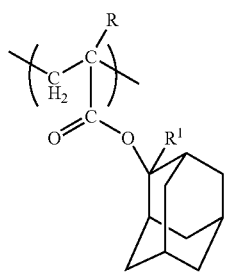

(I)

(in formula (I), R is the same as in the above, and $R^1$ represents a lower alkyl group.)

[Chemical formula 11]

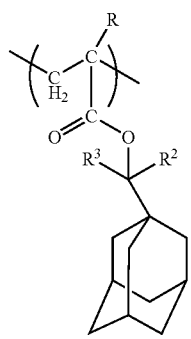

(II)

(in formula (II), R is the same as in the above, and each of $R^2$ and $R^3$ is a lower alkyl group independently.)

[Chemical formula 12]

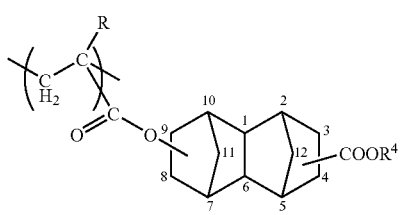

(III)

(in formula (III), R is the same as in the above, and $R^4$ represents a tertiary alkyl group.)

In the formula, as $R^1$, a linear or branched lower alkyl group having 1 to 5 carbon atoms is preferable, and a methyl group, ethyl group, propyl group, isopropyl group, n-butyl group, isobutyl group, pentyl group, isopentyl group, neopentyl group, etc. are exemplary. Among them, an alkyl group having 2 or more carbon atoms is preferable, and an alkyl group having 2 to 5 carbon atoms is more preferable. In this case, there is a tendency that acid dissociability increases compared to the case of a methyl group. It should be noted that a methyl group and ethyl group are industrially preferable.

As for the above $R^2$ and $R^3$, each is preferably a lower alkyl group having 1 to 5 carbon atoms, independently. Such a group has a tendency that the acid dissociability becomes higher than that of a 2-methyl-2-adamantyl group.

More specifically, each of $R^2$ and $R^3$ is preferably a linear or a branched lower alkyl group, independently, similar to the above $R^1$. In particular, both $R^2$ and $R^3$ are industrially preferably a methyl group. Specifically, a structural unit derived from 2-(1-adamantyl)-2-propyl (α-lower alkyl) acrylate is exemplary.

The above $R^4$ is a tertiary alkyl group having 4 to 10 carbon atoms, and is industrially preferably a tertiary alkyl group such as a tert-butyl group and tert-amyl group.

Moreover, although a —$COOR^4$ group may be bonded to the 3 or 4 position of the tetracyclododecanyl group shown in the formula, since these contain an isomer, it is not possible to identify the bonding position. Moreover, although the carboxyl group residue of an (α-lower alkyl) acrylate structural unit is also bonded to the 8 or 9 position similarly shown in the formula, the bonding position cannot be identified.

Since it excels in resolution, in the resin (A2) to be mixed, a structural unit (a5) is contained in an amount preferably ranging from 20 to 60 mol %, more preferably ranging from 30 to 50 mol % to the sum total of all of the structural units of resin (A2).

In resin (A2), the preferable conditions such as blending percentage, mass average molecular weight, etc. of structural units (a2), (a3) and (a4) are the same as in component (A1).

The preferable range of the whole of component (A) is also the same as that of component (A1).

Component (B)

In the present invention, as component (B), well-known acid generators which are currently used in the conventional chemically amplified resist composition can be used, without being limited particularly. Hitherto, as such an acid generator, various ones are known, onium salt type acid generators such as an iodonium salt, a sulfonium salt, etc.; oxime sulfonate type acid generators; diazomethane type acid generators, such as bisalkyl or bisaryl sulfonyl diazomethanes, poly(bissulfonyl) diazomethanes, diazomethane nitrobenzyl sulfonates, etc.; iminosulfonate type acid generators, disulfone type acid generators, etc.

As onium salt type acid generators, specifically, trifluoromethanesulfonate or nonafluorobutanesulfonate of diphenyliodonium, trifluoromethanesulfonate or nonafluorobutanesulfonate of bis(4-tert-butylphenyl)iodonium; trifluoromethanesulfonate of triphenylsulfonium, heptafluoropropanesulfonate thereof or nonafluorobutanesulfonate thereof; trifluoromethanesulfonate of tri(4-methylphenyl)sulfonate, heptafluoropropanesulfonate thereof or nonafluorobutanesulfonate thereof; trifluoromethanesulfonate of dimethyl(4-hydroxynaphthyl)sulfonium, heptafluoropropanesulfonate thereof or nonafluorobutanesulfonate thereof; trifluoromethanesulfonate of monophenyldimethylsulfonium, heptafluoropropanesulfonate thereof or nonafluorobutanesulfonate thereof; trifluoromethanesulfonate of diphenylmonomethylsulfonium, heptafluoropropanesulfonate thereof or nonafluorobutanesulfonate thereof, etc. are exemplary.

As an oximesulfonate type acid generator, specifically, α-(methyl sulfonyl oxyimino)-phenyl acetonitrile, α-(methyl sulfonyl oxyimino)-p-methoxyphenyl acetonitrile, α-(trifluoromethyl sulfonyl oxyimino)-phenyl acetonitrile, α-(trifluoromethyl sulfonyl oxyimino)-p-methoxyphenyl acetonitrile, α-(ethyl sulfonyl oxyimino)-p-methoxyphenyl acetonitrile, α-(propyl sulfonyl oxyimino)-p-methyl phenyl acetonitrile, α-(methyl sulfonyl oxyimino)-p-bromophenyl acetonitrile, etc. are exemplary. Among these, α-(methyl sulfonyl oxyimino)-p-methoxyphenyl acetonitrile is preferable.

In diazomethane type acid generators, as bisalkyl or bisaryl sulfonyl diazomethanes, specifically, bis(isopropyl sulfonyl) diazomethane, bis(p-toluene sulfonyl)diazomethane, bis(1, 1-dimethyl ethyl sulfonyl)diazomethane, bis(cyclohexyl sulfonyl)diazomethane, bis(2, 4-dimethylphenyl sulfonyl) diazomethane, etc. are exemplary.

Moreover, as poly(bis sulfonyl)diazomethanes, for example, 1,3-bis(phenyl sulfonyl diazomethyl sulfonyl)propane (Compound A, decomposition point 135° C.) having the structure shown below, 1,4-bis (phenyl sulfonyl diazomethyl sulfonyl) butane (Compound B decomposition point 147° C.), 1,6-bis(phenyl sulfonyl diazomethyl sulfonyl)hexane (Compound C, melting point 132° C., decomposition point 145° C.), 1,10-bis(phenyl sulfonyl diazomethyl sulfonyl)decane (Compound D, decomposition point 147° C.), 1,2-bis (cyclohexyl sulfonyl diazomethyl sulfonyl)ethane (Compound E, decomposition point 149° C.), 1,3-bis (cyclohexyl sulfonyl diazomethyl sulfonyl)propane (Compound F, decomposition point 153° C.), 1,6-bis(cyclohexyl sulfonyl diazomethyl sulfonyl)hexane (Compound G, melting point 109° C., decomposition point 122° C.), and 1,10-bis(cyclohexyl sulfonyl diazomethyl sulfonyl)decane (Compound H, decomposition point 116° C.), etc. are exemplary.

[Chemical formula 13]

Compound A
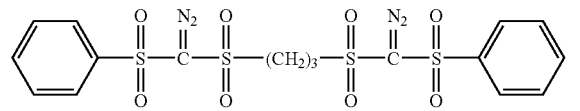

Compound B
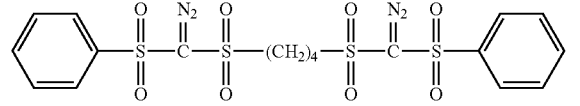

Compound C
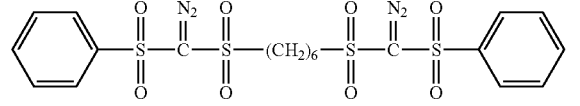

Compound D
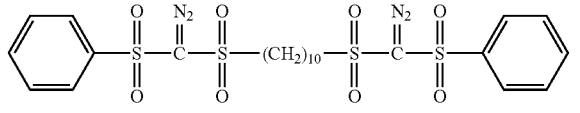

-continued

Compound E
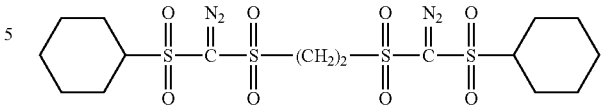

Compound F
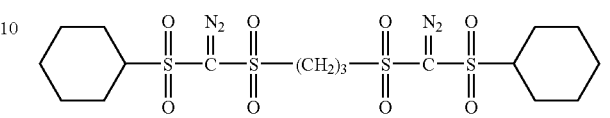

Compound G
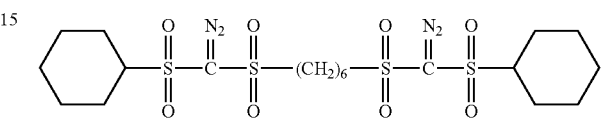

Compound H
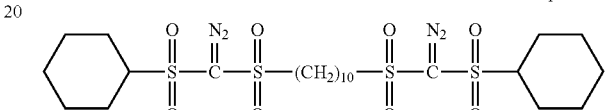

As component (B), one kind of acid generator may be used alone, and two or more acid generators may used in combination.

The content of component (B) ranges from 0.5 to 30 mass parts, preferably from 1 to 10 mass parts to 100 mass parts of component (A). If the content of component (B) is less than the above range, then there is a possibility that pattern formation may not sufficiently be performed, whereas if the content of component (B) is more than the above range, then there is a possibility that a uniform solution will be hard to obtain, such that storage stability may deteriorate.

Nitrogen-containing Organic Compound (D)

Into the positive type resist composition of the present invention, as a further arbitrary component, a nitrogen-containing organic compound (D) (referred to as "component (D)" below) may be blended, in order to improve the resist pattern form and the post exposure stability of the latent image formed by the pattern-wise exposure of the resist layer.

Since various substances have been already proposed, as component (D), it is possible to select any one from well-known ones and use it arbitrarily, however, amines, in particular secondary lower aliphatic amines, and tertiary lower aliphatic amines are preferable.

Here, the wording "lower aliphatic amine" means an amine of an alkyl or alkyl alcohol having a carbon number of five or less, and as the secondary amine or the tertiary amine, trimethylamine, diethyl amine, triethyl amine, di-n-propyl amine, tri-n-propyl amine, tri-pentyl amine, diethanol amine, triethanol amine, triisopropanol amine, etc. are exemplarly, however, in particular, a tertiary alkanol amine such as triethanol amine is preferable.

These may be used solely and two or more of them may be used in combination.

Component (D) is usually used in an amount ranging from 0.01 to 5.0 mass parts to 100 mass parts of component (A).

Component (E)

Moreover, an organic carboxylic acid, an oxoacid of phosphorus, or derivative thereof (E) (referred to as "component (E)" below) may be added as a further arbitrary component, in order to prevent deterioration of sensitivity due to addition of the above component (D) and to improve the resist pattern form and the post exposure stability of the latent image formed by the pattern-wise exposure of the resist layer. It should be noted that both components (D) and (E) can be used together, and either component (D) or (E) can be used.

As the organic carboxylic acid, for example, malonic acid, citric acid, malic acid, succinic acid, benzoic acid, salicylic acid, etc. are preferable.

As the oxoacid of phosphorus or derivatives thereof, phosphoric acid, or a derivative such as phosphoric di-n-butyl ester, and phosphoric diphenyl ester, etc.; phosphonic acid and derivatives such as phosphonic acid dimethyl ester, phosphonic acid-di-n-butyl ester, phenyl phosphate, phosphonic acid diphenyl ester, phosphonic acid dibenzyl ester, etc.; phosphinic acid and derivatives such as phenyl phosphinate, etc. are exemplary. Among these, phophonic acid is particularly preferable.

Component (E) is used in an amount ranging from 0.01 to 5.0 mass parts per 100 mass parts of component (A).

The Other Arbitrary Components

If necessary, the positive type resist composition of the present invention may further contain additives that have compatibility, such as additional resin for improving the performance of the resist layer, a surface active agent for improving applicability, a dissolution inhibitor, a plasticizer, a stabilizer, a colorant, an antihalation agent, etc. suitably.

Organic Solvent

The positive type resist composition of the present invention can be produced by dissolving materials in an organic solvent.

As the organic solvent, any one which can dissolve each component to be used to form a uniform solution can be used. From solvents which are conventionally known well as one for a chemically amplified resist, one or more can be selected arbitrarily and used.

For example, ketones such as γ-butyrolactone, acetone, methyl ethyl ketone, cyclohexanone, methyl isoamyl ketone, 2-heptanone, etc.; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or dipropylene glycol monoacetate monomethylether, monoethyl ether, monopropyl ether, monobutyl ether or monophenyl ether, etc.; cyclic ethers such as dioxane; esters, such as methyl lactate, ethyl lactate (EL), methyl acetate, ethyl acetate, butyl acetate, methyl pyruvate, ethyl pyruvate, methyl methoxy propionate, ethyl ethoxy propionate, etc. are exemplary.

These organic solvents may be used alone, and may be used as a mixed solvent containing two or more of them.

In the present invention, it is particularly preferable that the organic solvent contain ethyl lactate (EL). Thereby a thick resist layer can be easily produced even if the solid content of the resist composition is a comparatively low concentration of approximately 20 mass % in making a resist layer be a thick film, as mentioned below.

From this point of view, the concentration of EL in the organic solvent is preferably over 60 mass %, more preferably over 70 mass %. Although the EL concentration may be 100 mass %, there is a possibility of cracks being easily generated in the resist layer, and in that case it is preferable to add propylene glycol monomethyl ether acetate (PGMEA) thereto further. From a viewpoint of suppressing cracks, the PGMEA concentration ranges from 5 to 40 mass % in the organic solvent, and preferably ranges from 10 to 20 mass %.

Although the amount of organic solvent to be used is not particularly limited, the amount is suitably determined so as to be applicable onto a substrate, etc., based on the thickness of the coated film. The amount of organic solvent to be used generally ranges from 2 to 20 mass % in terms of solid content of the resist composition, and preferably ranges from 5 to 15 mass %.

The positive type resist composition of the present invention excels in cost, ion barrier properties, and destructive resistance of a resist pattern and hence is suitable as a positive type resist composition for use in ion implantation.

In particular, if a resist layer (resist pattern) having a thickness ranging from 1.0 to 2.0 μm, preferably ranging from 1.0 to 1.5 μm formed using the positive type resist composition which contains the above mixed solvent consisting of EL and PGMEA is used in ion implantation process, then no cracks will be generated in the resist layer (resist pattern), and it excels in ion barrier properties, and hence it is particularly preferable. Therefore, the positive type resist composition of the present invention is still more suitable for use in ion implantation to which such a process is applied.

[Process for Forming a Resist Pattern and Etching]

The process for forming a resist pattern of the present invention can be performed as follows, for example.

That is, at first the above positive type resist composition is applied by a spinner etc. onto a substrate such as a silicon wafer, then pre-baking is performed for 40 to 120 seconds, for 60 to 90 seconds at a temperature ranging from 80 to 150° C., and thereafter the resultant substrate is subject to selective exposure through a desired mask pattern using an exposing apparatus, and then PEB (Post Exposure Bake) is performed for 40 to 120 seconds, preferably 60 to 90 seconds under a temperature ranging from 80 to 150° C.

Subsequently, the resultant substrate is developed using an alkali developer, for example, a 0.1 to 10 mass % aqueous tetra-methyl ammonium hydroxide solution. Thus, a resist pattern which closely follows a mask pattern can be obtained.

Depending on the case, the above post baking process may be included after alkali development, and an antireflection film of an organic type or an inorganic type may be disposed between the substrate and the coated layer of the resist composition. The post baking is performed, for example, under the conditions of a temperature ranging from 90 to 150° C. and a period ranging from 30 to 90 seconds.

Subsequently, the substrate under the resist pattern is etched using the resist pattern as a mask. The etching method may be either a wet etching method, or dry etching method. In the case of wet etching, the etching is performed while immersing the substrate in an aqueous fluoric acid (hydrofluoric acid) solution having a concentration of approximately 20 mass % for 3 minutes, for example. In the case of dry etching, the etching is performed using halogen type gas such as tetrafluoromethane, trifluoromethane, etc.; helium gas, oxygen gas, etc., for example.

The positive type resist composition of the present invention is low cost, and excellent in dry etching resistance. Furthermore, the effect that the resist pattern after wet etching is hardly peeled is also obtained. Therefore, either dry etching, which is frequently used recently because of its high processing accuracy, or wet etching can be used, and hence the degree of freedom is high.

Moreover, the wavelength of light to be used for exposing is not limited particularly, and the exposing can be performed using ultraviolet radiation such as i line, g line, h line, etc., and radioactive rays such ArF excimer laser, KrF excimer laser, $F_2$ excimer laser, EUV (extreme ultraviolet rays), VUV (vacuum ultraviolet radiation) and EB (electron beam), X-rays, and soft X rays, etc.

The positive type resist composition in accordance with the present invention is particularly suitable for forming a thick resist layer by using an exposing apparatus for i lines, an exposing apparatus for a KrF excimer laser, and an exposing apparatus for ArF excimer laser. It is preferable to use an exposing apparatus for i line and an exposing apparatus for a KrF excimer laser from the viewpoint of cost reduction. From the point of view of fine processing, an exposing apparatus for an ArF excimer laser is preferable.

A thick resist layer means that the thickness after pre-baking ranges from 0.6 to 2.0 μm, preferably from 1.0 to 1.5 μm, for example.

[Process for Performing Ion Implantation]

The process for performing ion implantation of the present invention is a process which includes forming a resist layer onto a substrate using the positive type resist composition of the present invention, exposing selectively onto the resist layer, performing alkali development to form a resist pattern, and thereafter performing ion implantation using the resist pattern as a mask.

An ion implantation per se is well-known, which ionizes the target substance, and accelerates ions electrostatically, thereby implanting ions into a solid (thin film on a substrate).

As ion acceleration energy at the time of this ion implantation, an energy load ranging from 10 to 200 keV is applied to a resist pattern, and the resist pattern may be destroyed. As an ion source, ions, such as boron, phosphorus, arsenic, argon, etc. are exemplary. As a thin film on the substrate, silicon, silicon dioxide, silicon nitride, aluminum, etc. are exemplary.

In the process of the present invention, the above positive type resist composition may be used in such a process for performing ion implantation.

Since component (A1) has high transparency of, for example, not less than 0.11/gm of gram absorption coefficient to light having a wavelength of 193 nm [measuring method: well-known method which includes applying a solution of component (A1) onto a quartz glass substrate, drying it at 120° C. for 60 seconds to form a film having a thickness of 1.0 μm, and measuring this film by a spectrophotometer at a wavelength of 193 nm.], it can be used for a thick film having a thickness ranging from 0.6 to 2.0 μm, preferably from 1.0 to 1.5 μm.

Moreover, when forming a thick resist layer, it is possible to decrease the influence of standing waves due to reflection of exposed light, etc., even without forming an antireflection film, thereby providing an effect that deterioration of form of patterns such as standing waves, etc. hardly occur. This effect is effective especially in the process for performing ion implantation which does not necessitate an antireflection film.

In accordance with the present invention, since the structural unit (a1) which has the acid-dissociable, dissolution-inhibiting groups which consist of the chain tertiary alkyl group can be used, significant cost reduction can be obtained. Moreover, the dry etching resistance, the ion barrier properties during the ion implantation process, and the destructive resistance of a resist pattern which are required, are also satisfied.

Here, an acrylic type resin which has acid-dissociable, dissolution-inhibiting groups consisting of the chain tertiary alkyl group like structural unit (a1) was conventionally considered to be remarkably inferior in dry etching resistance, and hence it was not used. For example, in Patent document 1, in paragraph [0029], it is disclosed that even if a substance has acid-dissociable, dissolution-inhibiting groups which contain monocyclic and alicyclic groups, the substance is insufficient in dry etching resistance, and it is suggested that if a substance is a chain tertiary alkyl group, then it will be further inferior in the dry etching resistance. Therefore, based on conventional technical common sense, structural unit (a1) cannot have been adopted from the viewpoint of "dry etching resistance", which is an object of the present invention.

On the other hand, the inventors of the present invention have found that the required dry etching resistance, the ion barrier properties during the ion implantation process, and the destructive resistance of a resist pattern can be obtained by combining structural units (a1), (a2) and (a3) suitably, even if structural unit (a1) is introduced, and as a result they have completed the present invention, which realizes both reduction of cost and improvement of dry etching resistance at the same time.

Moreover, the objects of reduction of cost, improvement of the ion barrier properties during ion implantation and the destructive resistance of a resist pattern have also been attained.

In accordance with the present invention, the effect of excelling in wet etching ability (characteristic in that the interface between the resist layer and the substrate is hardly peeled) is also further obtainable.

Moreover, in accordance with the present invention, resolution is also comparatively excellent.

EXAMPLES

Synthetic Example 1

Polymer 1

A resin component (polymer 1) which consists of 40 mol % of the following structural unit (a1), 40 mol % of structural unit (a2) and 20 mol % of structural unit (a3) was synthesized. The mass average molecular weight of the polymer 1 was 8660, and the degree of dispersion (mass average molecular weight/number average molecular weight) was 1.78.

Structural unit (a1): The structural unit in which R=methyl group and $R^{11}$=tert-butyl in the above general formula (1).

Structural unit (a2): The structural unit in which R=methyl group in the above general formula (VII).

Structural unit (a3): The structural unit bonded to the tertiary position of an adamantyl group, in which R=methyl group, n=1, and X is a hydroxyl group in the above general formula (VIII).

Synthetic Example 2

Polymer 2

A resin component (polymer 2) which consists of 40 mol % of the following structural unit (a1), 40 mol % of structural unit (a2) and 20 mol % of structural unit (a3) was synthesized. The mass average molecular weight of polymer 2 was 9000, and the degree of dispersion (mass average molecular weight/number average molecular weight) was 1.78.

Structural unit (a1): The structural unit in which R=methyl group and $R^{11}$=tert-butyl in the above general formula (1)

Structural unit (a2): The structural unit in which is R=methyl group in the above general formula (VII).

Structural unit (a3): The structural unit bonded to the tertiary position of an adamantyl group, in which R=methyl group, n=1, and X is a CN group, in the above general formula (VIII).

Comparative Synthesis Example 1

Polymer 3

A resin component (polymer 3) which consists of 40 mol % of the following structural unit (a5), 40 mol % of structural unit (a2) and 20 mol % of structural unit (a3) was synthesized. The mass average molecular weight of the polymer 3 was 13000, and the degree of dispersion (mass average molecular weight/number average molecular weight) was 1.93.

Structural unit (a5): The structural unit derived from 2-methyl adamantyl methacrylate in which R=methyl group and $R^1$ is a methyl group in the above general formula (I).
Structural unit (a2): The structural unit in which R=methyl group in the above general formula (VII).
Structural unit (a3): The structural unit in which R=methyl group, n=1, and X is a hydroxyl group, in the above general formula (VIII), and has been bonded to the tertiary position of an adamantyl group.

Example 1

Above polymer 1 [which corresponds to component (A1)] as component (A) and the following material were dissolved in an organic solvent and the positive type resist composition was produced.
Component (A): 100 mass parts
Component (B): 2 mass parts of a triphenyl sulfonium nonafloorobutanesulfonate to 100 mass parts of component (A).
Organic solvent: Mixed solvent of EL/PGMEA=9/1 (mass ratio), 408 mass parts (20% concentration of solid content as a resist solution) to 100 mass parts of component (A).
Component (D): triethanol amine, 0.1 mass parts to 100 mass parts of component (A).

Example 2

A positive type resist composition was produced by the same way as in Example 1 with the exception of using the above polymer 2 [which corresponds to component (A1)] as component (A).

Comparative Example

A positive type resist composition was produced by the same way as in Example 1 with the exception of using the above polymer 3 as component (A). It should be noted that since the above polymer uses the structural unit derived from 2-methyl adamantyl methacrylate, the object of the reduction in cost is not attained.

(Evaluation Method and Result) (Test Method 1) Peeling by Wet Etching 1.

Onto a silicon substrate 1 (which had been subjected to hexamethyldisilazane treatment under the conditions of a temperature of 90° C. for 35 seconds) on which an oxide film ($SiO_2$) was coated, a positive type resist composition was applied using a spinner, and pre-baking was performed on a hot plate at a temperature of 120° C. for 60 seconds to form a resist layer of 1.3 μm after pre-baking. Thereafter, using an ArF exposing apparatus, NSR-S302 (product name, produced by NIKON Co. Ltd.; NA (numerical aperture)= 0.6, ⅔-annular illumination), an ArF excimer laser (193 nm) was selectively exposed through a mask pattern.

And PEB treatment was performed at 130° C. for 60 seconds, and then development was performed for 45 seconds using an aqueous 2.38 mass % tetra-methyl ammonium hydroxide solution at 23° C. It should be noted that, an LD nozzle of a scanning type was used at this time.

Thus, after a pattern of 300 μm in size was formed, postbaking was performed at 100° C. for 60 seconds, and then the resultant sample was immersed in an aqueous fluoric acid (hydrofluoric acid) solution having a concentration of approximately 20 mass % for 3 minutes to perform wet etching, and thereafter, the resultant sample was observed with respect to peeling of the pattern through an electron microscope.

(Test Method 2) Peeling by Wet Etching 2

Evaluation was performed by the same way as in the test method 1, with the exception of using a silicon substrate 2 on which an oxide film was formed by performing hexamethyldisilazane treatment under the conditions of 150° C. for 35 seconds.

Results

In Comparative Example, the pattern had been removed completely.

In Examples 1 and 2, in the interface between the substrate and the pattern, slit-like side-etching was generated on the edge of the pattern, however, the pattern per se was remained. Size of the side-etching (the length from the edge of the pattern to the slit tip-end of the slit generated on the side cross-section of the patterns) was as follows, which was slight.

Example 1: Substrate 1, 1.97 μm; Substrate 2, 1.29 μm
Example 2: board 1, 2.47 μm; Substrate 2, 2.17 μm 2) Resolution and Observation of the Form Exposure was performed at the optimal conditions such that a pattern having 0.5 82 m of line & space was formed at 1:1, using substrate 1. As a result, all of the positive type resist composition of Examples 1 and 2 and Comparative Example was sufficiently resolved to the 0.5 μm of line & space, and no pattern collapses were generated.

Moreover, each pattern form was rectangular and there was no influence of standing waves.

3) Evaluation Method of Dry Etching Resistance and Results

As to resist compositions of Examples 1 and 2, resist patterns having a line width of 0.5 μm were formed, the using substrate 1, and then dry etching was performed under the following conditions using an etching apparatus produced by TOKYO OHKA KOGYO Co., Ltd.

Moreover, here for comparison, a resist composition for use in a general KrF excimer laser which contains a resin having polyhydroxyl groups of which hydroxyl grous are partially protected with acid-dissociable, dissolution-inhibiting groups was used.

Conditions:
Type and flow rate of the etching gas: Mixed gas of tetrafluoromethane 30 cc/min., trifluoromethane 30 cc/min., and helium 100 cc/min.
Pressure: 300 mmTorr
Output power: 600 W
Time: 120 seconds As a result, the resist patterns formed using the resist compositions of Examples 1 and 2 had a remaining amount of resist film of 90% and exhibited considerably good dry etching resistance, compared to the KrF resist having the base resin having polyhydroxy styrene of which the hydroxyl groups are partially protected with acid-dissociable, dissolution-inhibiting groups.

4) Evaluation Method of Ion Barrier Properties and Results

As to the resist compositions of Examples 1 and 2 i.e., the same method as in those described in the peeling by wet-etching 1 up to pre-baking was performed to obtain a resist layer having a thickness of 1.3 μm. Ion barrier properties were evaluated in these layers through a well-known ion implanting apparatus, and it revealed that the ion barrier properties were satisfactory. Moreover, as ion accelerating energy at the time of ion implantation, although an energy load ranging from 10 to 200 keV was applied to the resist pattern, the resist pattern was not destroyed. Moreover, although the formed resist pattern did not form an antireflection film, it had an excellent pattern form having no standing waves.

Thus, in accordance with the resist compositions of Examples 1 and 2 of the present invention, they excel in dry etching resistance, ion barrier properties during ion implantation, and destructive resistance. Therefore, it turned out that both cost reduction and dry etching resistance are possible. Moreover, it turned out that all of cost reduction, ion barrier properties, and destructive resistance can be attained simultaneously. The resolution was also practically satisfactory. Furthermore, the wet etching property was excellent.

INDUSTRIAL APPLICABILITY

The present invention provides a positive type resist composition using an acryl type resin used for producing a semiconductor device or a liquid crystal display device, which excels in cost reduction, ion barrier properties in an ion implantation process and destructive resistance of a resist pattern, and is very useful in industry.

The invention claimed is:

1. A positive type resist composition comprising a resin component (A) for use in a resist, having alkali solubility which increases under the action of an acid, an acid generator component (B) which generates an acid upon being exposed, and an organic solvent which dissolves the resin component (A) and the acid generator component (B), wherein the resin component (A) consists of the following structural units (a1), (a2) and (a3):

structural unit (a1): a structural unit derived from an (α-lower alkyl) acrylic ester which contains acid-dissociable, dissolution-inhibiting groups expressed by the following general formula (1):

[chemical formula 1]

[chemical formula 1]

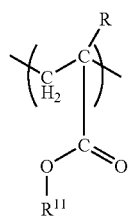

(1)

(in formula (1), R represents a hydrogen atom or a lower alkyl group, $R^{11}$ represents acid-dissociable, dissolution-inhibiting groups consisting of chain tertiary alkyl groups);

structural unit (a2): a structural unit derived from an (α-lower alkyl) acrylic ester which contains lactone-containing monocyclic or polycyclic groups, wherein said structural unit (a2) is expressed as the following constitutional formulae (IV) to (VII):

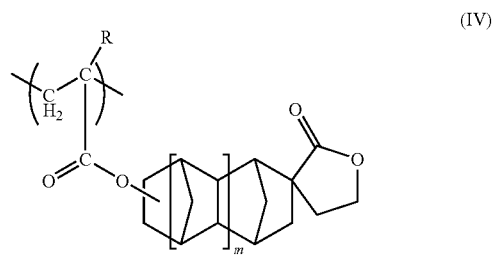

(IV)

(in formula (IV), R is the same as the above, and m is 0 or 1)

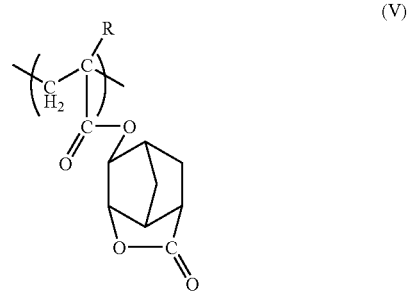

(V)

(in formula (V), R is the same as the above)

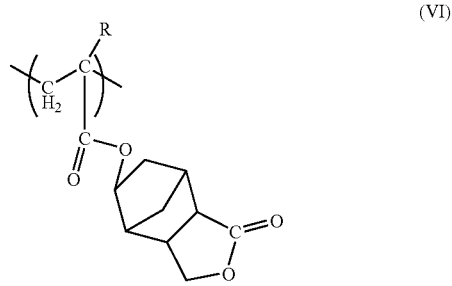

(VI)

(in formula (VI), R is the same as the above), or

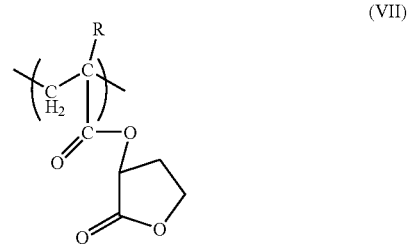

(VII)

(in formula (VII), R is the same as above); and structural unit (a3): a structural unit derived from an (α-lower alkyl) acrylic ester which contains polycyclic and alicyclic hydrocarbon groups which contain polar groups.

2. The positive type resist composition as set forth in claim 1, wherein said acid-dissociable, dissolution-inhibiting groups in said structural unit (a1) are tert-butyl groups.

3. The positive type resist composition as set forth in claim 1 wherein said structural unit (a2) is a structural unit expressed as the following general formula:

[chemical formula 2]

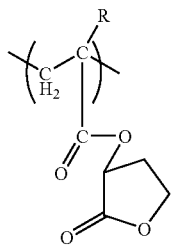

(in the formula, R represents a hydrogen atom or a lower alkyl group)

4. The positive type resist composition as set forth in claim 1, wherein said structural unit (a3) is a structural unit expressed as the following general formula

[chemical formula 3]

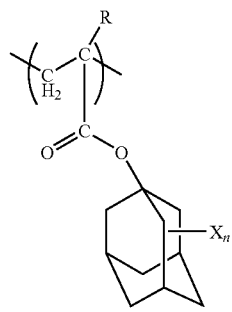

(wherein R represents a hydrogen atom or a lower alkyl group, X represents a polar group, and n represents an integer of 1 to 3.

5. The positive type resist composition as set forth in claim 1, wherein said organic solvent contains ethyl lactate (EL).

6. The positive type resist composition as set forth in claim 5, wherein said organic solvent further contains propylene glycol monomethyl ether acetate (PGMEA).

7. The positive type resist composition as set forth in claim 1, further comprising a nitrogen-containing organic compound.

8. A positive type resist composition for use in ion implantation as set forth in claim 1.

9. A process for forming a resist pattern, comprising: forming a resist layer on a substrate using said positive type resist composition as set forth in claim 1, exposing selectively onto said resist layer, and thereafter performing alkali development to form a resist pattern.

10. A process for performing an ion implantation, comprising:
forming a resist layer on a substrate using a positive type resist, exposing selectively onto said resist layer, performing alkali development to form a resist pattern, and thereafter performing ion implantation while using said resist pattern as a mask, wherein said positive type resist composition is a positive type resist composition comprising a resin component (A) for use in a resist, having alkali solubility which increases under the action of an acid, an acid generator component (B) which generates an acid upon being exposed, and an organic solvent which dissolves the resin component (A) and the acid generator component (B), wherein the resin component (A) consists of the following structural units (a1), (a2) and (a3):
structural unit (a1): a structural unit derived from an ($\alpha$-lower alkyl) acrylic ester which contains acid-dissociable, dissolution-inhibiting groups expressed by the following general formula (1):

[chemical formula 1]

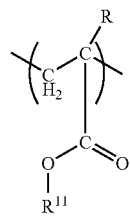

(1)

(in formula (1), R represents a hydrogen atom or a lower alkyl group, $R^{11}$ represents acid-dissociable, dissolution-inhibiting groups consisting of chain tertiary alkyl groups),
structural unit (a2): a structural unit derived from an ($\alpha$-lower alkyl) acrylic ester which contains lactone-containing monocyclic or polycyclic groups, and
structural unit (a3): a structural unit derived from an ($\alpha$-lower alkyl) acrylic ester which contains polycyclic and alicyclic hydrocarbon groups which contain polar groups.

* * * * *